(12) United States Patent
Yan et al.

(10) Patent No.: US 11,784,659 B2
(45) Date of Patent: Oct. 10, 2023

(54) CIRCUIT SYSTEM FOR WEIGHT MODULATION AND IMAGE RECOGNITION OF MEMRISTOR ARRAY

(71) Applicant: Hebei University, Baoding (CN)

(72) Inventors: Xiaobing Yan, Baoding (CN); Ziliang Fang, Baoding (CN); Saibo Yin, Baoding (CN)

(73) Assignee: Hebei University, Baoding (CN)

( * ) Notice: Subject to any disclaimer, the term of this patent is extended or adjusted under 35 U.S.C. 154(b) by 66 days.

(21) Appl. No.: 17/676,109

(22) Filed: Feb. 18, 2022

(65) Prior Publication Data

US 2023/0089959 A1 Mar. 23, 2023

(30) Foreign Application Priority Data

Sep. 22, 2021 (CN) .......................... 202111118005.0

(51) Int. Cl.
*H03M 1/00* (2006.01)
*H03M 1/46* (2006.01)
*H03M 1/12* (2006.01)
*H03M 1/66* (2006.01)

(52) U.S. Cl.
CPC ......... *H03M 1/468* (2013.01); *H03M 1/1245* (2013.01); *H03M 1/462* (2013.01); *H03M 1/66* (2013.01)

(58) Field of Classification Search
CPC ........ H03M 1/66; H03M 1/12; H03M 1/1245; H03M 1/462; H03M 1/468; H03M 3/50; G06F 17/16; G06F 11/1068; G06F 15/00; G06N 3/065; G06N 3/044; G06N 3/063; G06N 3/045; G06N 3/04; G06N 3/02; G06N 3/08; G11C 13/0069; G11C 13/004; G11C 11/54; G11C 2213/77;
(Continued)

(56) References Cited

U.S. PATENT DOCUMENTS

| 2014/0172937 | A1* | 6/2014 | Linderman | G06G 7/16 708/607 |
| 2015/0213884 | A1* | 7/2015 | Taha | G11C 13/0069 365/148 |
| 2016/0343432 | A1* | 11/2016 | Henze | G11C 13/004 |

(Continued)

*Primary Examiner* — Linh V Nguyen
(74) *Attorney, Agent, or Firm* — Bayramoglu Law Offices LLC

(57) ABSTRACT

A circuit system for weight modulation and image recognition of a memristor array includes a personal computer (PC), a field-programmable gate array (FPGA) chip, a digital-to-analog conversion unit, a switch unit, a memristor array unit, an integration and signal amplification circuit, and an analog-to-digital converter. The circuit system selects a to-be-realized function such as array reading and writing, weight modulation or image recognition, converts a command or an RGB value of an image collected by the PC into a corresponding grayscale value, and sends the grayscale value to the FPGA chip. The FPGA chip controls and selects a to-be-modulated memristor array unit through the digital-to-analog conversion unit and the switch unit. An application program of the PC controls the FPGA chip in real time to realize array reading and writing, weight modulation, and image recognition, and then the FPGA chip displays a result on the PC in real time.

8 Claims, 8 Drawing Sheets

(58) Field of Classification Search
CPC .............. G11C 7/1006; G11C 2213/79; G11C 11/1673; G11C 13/0026
USPC ................. 341/110, 141, 133, 144, 155, 142
See application file for complete search history.

(56) References Cited

U.S. PATENT DOCUMENTS

| | | | |
|---|---|---|---|
| 2017/0228345 A1* | 8/2017 | Gupta | G06G 7/19 |
| 2017/0249989 A1* | 8/2017 | Strachan | G11C 11/1673 |
| 2018/0004708 A1* | 1/2018 | Muralimanohar | H03M 1/12 |
| 2018/0095930 A1* | 4/2018 | Lu | G11C 13/0002 |
| 2018/0114569 A1* | 4/2018 | Strachan | G11C 11/54 |
| 2018/0309451 A1* | 10/2018 | Lu | H04Q 3/0004 |
| 2019/0019564 A1* | 1/2019 | Li | G11C 16/0466 |
| 2019/0205741 A1* | 7/2019 | Gupta | G06F 17/13 |
| 2020/0193300 A1* | 6/2020 | Kumar | G06N 3/065 |

* cited by examiner

FIG. 12

CIRCUIT SYSTEM FOR WEIGHT MODULATION AND IMAGE RECOGNITION OF MEMRISTOR ARRAY

CROSS REFERENCE TO THE RELATED APPLICATIONS

This application is based upon and claims priority to Chinese Patent Application No. 202111118005.0, filed on Sep. 22, 2021, the entire contents of which are incorporated herein by reference.

TECHNICAL FIELD

The present invention relates to the technical field of memristors, and specifically, to a circuit system for weight modulation and image recognition of a memristor array.

BACKGROUND

In the past decades, transistor integrated circuits have developed rapidly according to Moore's law, and performance of electronic computers change quickly. Since the invention of the electronic computers, the Von Neumann architecture has been dominant. In the past decades, the Von Neumann system has achieved a great success. However, with the advent of the era of Internet of Things, cloud computing, and big data, in-depth analysis and processing of massive unstructured data need a higher computing speed and energy efficiency. A computing system under the Von Neumann architecture is gradually inadequate, and the continuation of Moore's Law is also facing great challenges. Therefore, the search for a new energy-efficient computing technology is an important direction of current research.

A memristor is a new nanometer device. Determined by an excitation history, resistance of the memristor is nonvolatile and continuously variable. The memristor provides a new physical foundation for the development of a new energy-efficient storage and computing integrated computing system. The memristor has advantages of a high integration density, a high operation speed, low power consumption, nonvolatility, and the like. It is considered as one of strong competitors of storage-computing integrated basic devices, and provides a practical solution for realization of the integrated storage and computing technology.

The memristor is usually integrated with a high density by using a cross array. When a column voltage vector is applied to one end of a memristor cross array, an output-row current vector at the other end is a product of the applied column voltage vector and a memristor conductance matrix. In other words, based on Ohm's law and Kirchhoff's voltage law, the memristor array can complete multiplication and accumulation operations for a vector and a matrix in one cycle. A multiplication factor is directly stored in the memristor array, and no separate storage unit is required, thereby bypassing a Von Neumann bottleneck. Moreover, computational energy efficiency of a core unit based on the multiplication and accumulation operations of the memristor array is two orders of magnitude higher than that of an existing complementary metal oxide semiconductor (CMOS) device, which is of great significance for an intelligent processing task with a large quantity of multiplication and accumulation operations.

SUMMARY

The present invention is intended to provide a circuit system for weight modulation and image recognition of a memristor array, and to realize information reading, memristor weight modulation, and image recognition of a memristor array.

The present invention is implemented as follows: a circuit system for weight modulation and image recognition of a memristor array includes a personal computer (PC), a field-programmable gate array (FPGA) chip, a digital-to-analog conversion unit, a switch unit, a memristor array unit, an integration and signal amplification circuit, and an analog-to-digital converter.

The PC is connected to the FPGA chip, the FPGA chip is further connected to the digital-to-analog conversion unit and the analog-to-digital converter, and the FPGA chip adopts an FPGA core board.

The digital-to-analog conversion unit is configured to receive a digital signal sent by the FPGA chip, perform voltage reduction on the digital signal, convert the digital signal into a corresponding pulse signal, and output the pulse signal to the switch unit, such that the switch unit performs selection to control the memristor array unit.

The switch unit includes two two-way 2-to-1 switch units and six 16-to-1 switch units, where an input terminal of one two-way 2-to-1 switch unit is connected to an output terminal of the digital-to-analog conversion unit; the two-way 2-to-1 switch unit has two output terminals, and one output terminal is connected to a source of a CMOS transistor of a device in the memristor array unit through two 16-to-1 switch units, and the other output terminal is connected to a gate of the CMOS transistor of the device in the memristor array unit through the other two 16-to-1 switch units; a drain of the CMOS transistor of the device in the memristor array unit is connected to the other two-way 2-to-1 switch unit through the remaining two 16-to-1 switch units, the other two-way 2-to-1 switch unit is connected to the analog-to-digital converter through the integration and signal amplification circuit, and the other two-way 2-to-1 switch unit is configured to control an integration circuit to perform charging and discharging, and does not perform selective output on 32 output terminals of the memristor array unit; discharging needs to be performed after each integration operation is performed, such that the other two-way 2-to-1 switch unit controls the integration circuit to perform discharging after each output; and therefore, the switch unit in the present invention is configured to control on/off states of 32×32 signals of a memristor array; in other words, control on/off states of a source, a gate, and a drain of a CMOS transistor of a single device in the memristor array unit.

The memristor array unit is configured to convert the received pulse signal into a corresponding current signal, and output the current signal to the switch unit for selective output.

The integration and signal amplification circuit is configured to convert the current signal output by the memristor array unit into a corresponding voltage signal, amplify the voltage signal, and output the amplified voltage signal to the analog-to-digital converter.

The analog-to-digital converter is configured to convert an analog signal output by the integration and signal amplification circuit into a corresponding digital signal, and send the digital signal to the FPGA chip.

The circuit system provided in the present invention has the following functions: reading and writing of a single device in the memristor array, reading and writing of the whole array, weight modulation of a single device in the memristor array, array weight modulation, and image recognition. In addition, the circuit system can regulate and control the source and the gate of the CMOS transistor in the memristor array unit.

The two-way 2-to-1 switch unit includes a TMUX6136 chip. The 16-to-1 switch unit includes a MUX506 chip.

The digital-to-analog conversion unit includes an AD7847 digital-to-analog conversion chip and two AD711 operational amplifiers, can perform digital-to-analog signal conversion with a maximum 12-bit resolution based on a demand, and amplify an output signal.

The integration and signal amplification circuit includes the integration circuit and a signal amplification circuit; the integration circuit includes an IF356 chip; the signal amplification circuit includes a first-stage amplification circuit and a second-stage amplification circuit; and the first-stage amplifier circuit includes a PGA202 chip, and the second-stage amplifier circuit includes a PGA203 chip. The first-stage amplification circuit and the second-stage amplification circuit are respectively connected to a zeroing circuit, and the zeroing circuit includes an OPA602 chip.

The analog-to-digital converter includes an AD574 analog-to-digital conversion chip and a 74LS373 latch. The analog-to-digital converter converts a signal transmitted by the integration and signal amplification circuit, and then sends a converted signal to the FPGA chip.

Compared with the prior art, the present invention has the following unique features:

The present invention selects, by using specific software of the PC, a to-be-realized function such as array reading and writing, weight modulation or image recognition, converts a command or an RGB value of an image that is collected by the PC into a corresponding grayscale value, and sends the grayscale value to the FPGA chip. The FPGA chip controls and selects a to-be-modulated memristor array unit. Specifically, the FPGA chip controls the digital-to-analog conversion unit, such that the digital-to-analog conversion unit performs voltage reduction to convert a digital signal into a corresponding pulse signal with a 12-bit resolution, and outputs the pulse signal to the 32×32 memristor array unit. The memristor array unit converts the received pulse signal into a corresponding current signal and sends the current signal to the integration and signal amplification unit through the 16-to-1 switch unit. The integration and signal amplification unit performs integration on the received small pulse signal, amplifies the small pulse signal based on a magnification factor as required, and transmits the amplified pulse signal to the analog-to-digital converter. The analog-to-digital converter converts a received analog signal into a corresponding digital signal and transmits the digital signal to the FPGA chip. The FPGA chip transmits received information to the PC and matches the received information with a signal in a database to obtain a corresponding result, to realize information reading, weight modulation, and image recognition of the memristor array unit.

BRIEF DESCRIPTION OF THE DRAWINGS

FIG. 12 is a circuit configuration diagram of a second integration and signal amplification circuit according to the present invention.

DETAILED DESCRIPTION OF THE EMBODIMENTS

Figure 1:
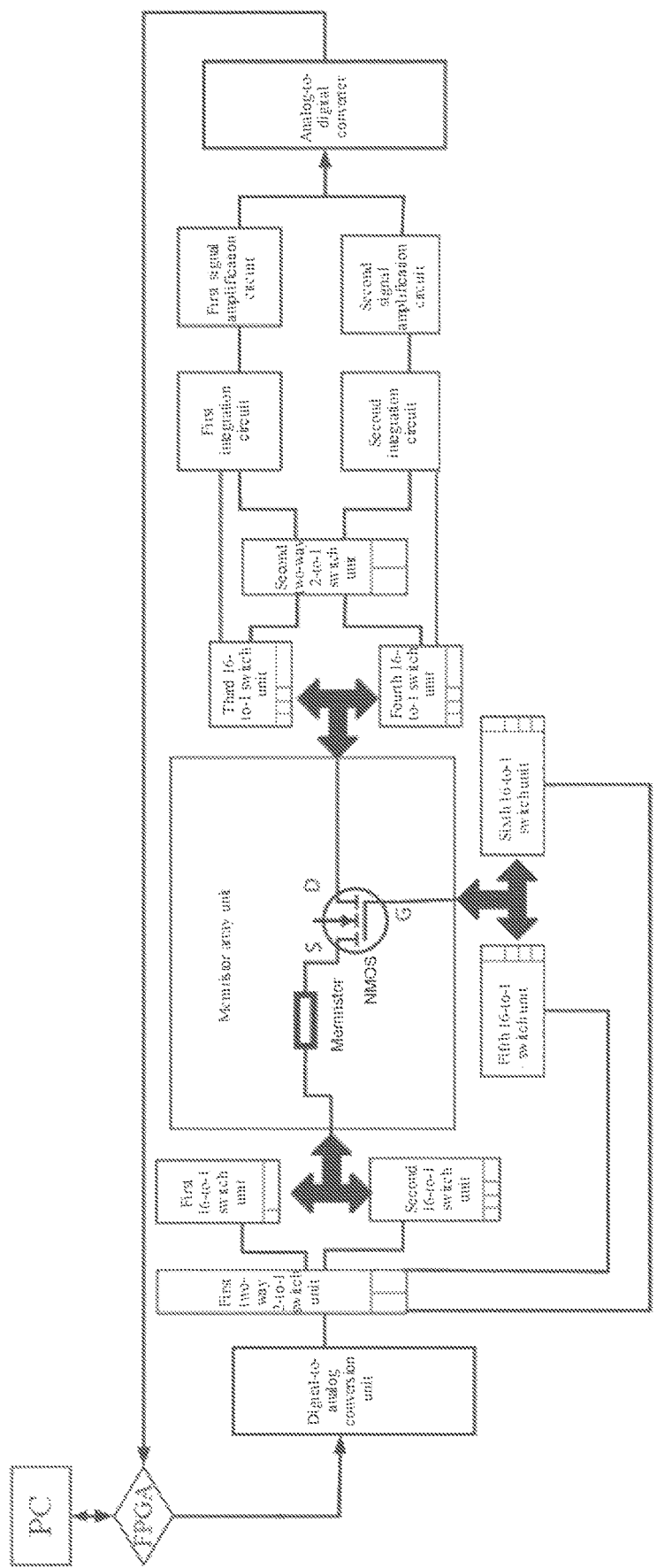
FIG. 1 is an overall block diagram of a circuit system for weight modulation and image recognition of a memristor array according to the present invention.

The present invention provides a circuit system for weight modulation and image recognition of a memristor array. The circuit system is also referred to as a memristor array reading and writing circuit. An overall framework of the circuit is shown in FIG. 1. The circuit specifically includes a PC, an FPGA chip, a digital-to-analog conversion unit, a switch unit (including two two-way 2-to-1 switch units and six 16-to-1 switch units), a memristor array unit, an integration and signal amplification circuit (including two integration circuits and two signal amplification circuits), and an analog-to-digital converter.

Figure 2:
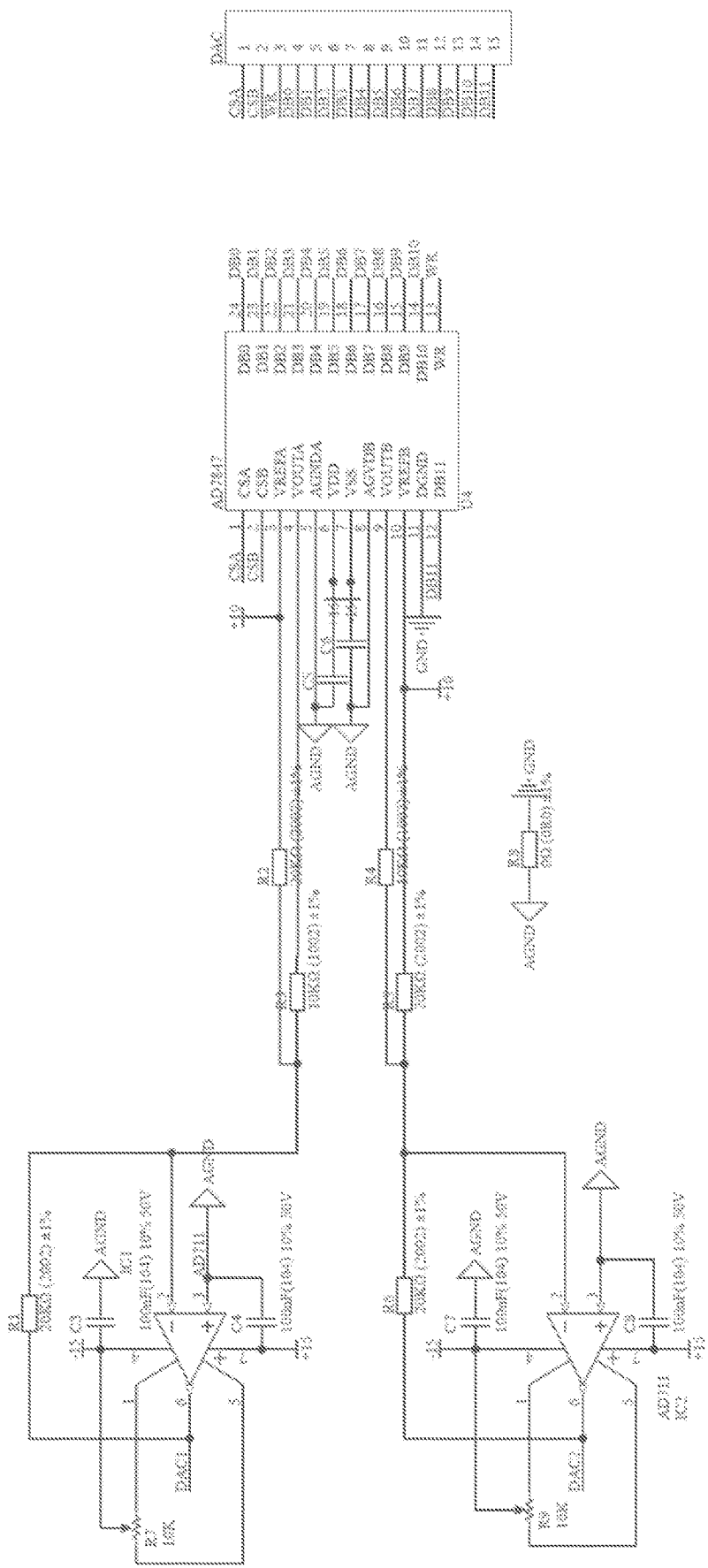
FIG. 2 is a circuit configuration diagram of a digital-to-analog conversion unit according to the present invention.

The digital-to-analog, conversion unit is configured to perform voltage reduction on a received digital signal, convert the digital signal into a corresponding pulse signal, and output the pulse signal to one two-way 2-to-1 switch unit of the switch unit. A circuit of the digital-to-analog conversion unit is shown in FIG. 2.

The digital-to-analog conversion unit includes a digital-to-analog conversion chip (AD7847), an operational amplification circuit, a first resistor R1, a second resistor R2, a third resistor R3, a fourth resistor R4, a fifth resistor R5, and a sixth resistor R6. The operational amplification circuit includes a first operational amplifier and a second operational amplifier.

15 input terminals, namely, CSA, CSB, WR, and DB0 to DB11, of the digital-to-analog conversion chip are respectively connected to 15 pins of a 15-pin pin header. Ports DGND, AGVDB, and AGNDA of the digital-to-analog conversion chip are grounded. Ports VREFA and VREFB of the digital-to-analog conversion chip each are connected to a +10V power supply, port VDD is connected to a +15V power supply, and port VSS is connected to a −15V power supply. Ports VOUTA and VOUTB are connected to the operational amplification circuit through the resistors, to amplify an output signal.

In the operational amplification circuit, a reverse input terminal (port 2) of the first operational amplifier IC1 (AD711) is connected to port 4, namely, port VOUTA, of the digital-to-analog conversion chip through the third resistor R3, connected to port 3, namely, port VREFA, of the digital-to-analog conversion chip through the second resistor R2, and connected to port 6 of the first operational amplifier through the first resistor R1. Port 6 of the first operational amplifier serves as a first output terminal DAC1 of the digital-to-analog conversion unit. A positive input terminal (port 3) of the first operational amplifier is coupled with port AGND. Ports +VCC and −VCC of the first operational amplifier are respectively connected to the ±15V power supplies through a filter capacitor.

A reverse input terminal (port 2) of the second operational amplifier IC2 (AD711) is connected to port 9, namely, port VOUTB, of the digital-to-analog conversion chip through the fourth resistor R4, connected to port 10, namely, port VREFB, of the digital-to-analog conversion chip through the fifth resistor R5, and connected to port 6 of the second operational amplifier through the sixth resistor R6. Port 6 of the second operational amplifier serves as a second output terminal DAC2 of the digital-to-analog conversion unit. A positive input terminal (port 3) of the second operational amplifier is coupled with port AGND. Ports +VCC and −VCC of the second operational amplifier are respectively connected to the ±15V power supplies through the filter capacitor.

The digital-to-analog conversion unit is configured to perform voltage reduction on the received digital signal and convert, the digital signal into a corresponding pulse signal according to the following formulas:

| DAC Latch Contents MSB LSB | Analog Output, $V_{OUT}$ |
| --- | --- |
| 1111 1111 1111 | $+V_{IN} \times \left(\frac{2047}{2048}\right)$ |
| 1000 0000 0001 | $+V_{IN} \times \left(\frac{1}{2048}\right)$ |
| 1000 0000 0000 | 0 V |
| 0111 1111 1111 | $-V_{IN} \times \left(\frac{1}{2048}\right)$ |
| 0000 0000 0000 | $-V_{IN} \times \left(\frac{2048}{2048}\right) = -V_{IN}$ |

In the above formulas, VOUT represents the converted pulse signal, and VIN represents the received digital signal. The listed digital signals and corresponding formulas in the above table are end values. A numerator of a corresponding formula increases by 1 as a value of any intermediate digital signal increases by 1.

The switch unit is configured to select a source and a gate of a CMOS transistor of a device in the memristor array unit, input pulse signal output by the digital-to-analog conversion unit into the source and the gate of the corresponding device, and perform selective output on an output terminal of a drain. Therefore, the switch unit is connected to the source, gate, and drain of the CMOS transistor of the device in the memristor array unit.

As shown in FIG. 1, the switch unit includes the two two-way 2-to-1 switch units and the six 16-to-1 switch units. An output terminal of the digital-to-analog, conversion unit is connected to one two-way 2-to-1 switch unit, The two two-way 2-to-1 switch units are denoted as a first two-way 2-to-1 switch unit and a second two-way 2-to-1 switch unit respectively, and the six 16-to-1 switch units are denoted as a first 16-to-1 switch unit, a second 16-to-1 switch unit, a third 16-to-1 switch unit, a fourth 16-to-1 switch unit, a fifth 16-to-1 switch unit, and a sixth 16-to-1 switch unit respectively. The first two-way 2-to-1 switch unit is connected to the first 16-to-1 switch unit, the second 16-to-1 switch unit, the fifth 16-to-1 switch unit, and the sixth 16-to-1 switch unit, and the second two-way 2-to-1 switch unit is connected to the third 16-to-1 switch unit and the fourth 16-to-1 switch unit. The second two-way 2-to-1 switch unit is further connected to the two integration circuits.

The memristor array unit is configured to convert the received pulse signal into a corresponding current signal, and output the current signal to the switch unit for selective output. The memristor array unit is a 32×32 memristor array unit. A source port of the 32×32 memristor array unit is connected to the first 16-to-1 switch unit and the second 16-to-1 switch unit to serve as an input of the memristor array unit. A gate port of the 32×32 memristor array unit is connected to the fifth 16-to-1 switch unit and the sixth 16-to-1 switch unit to serve as an input of the memristor array unit. A drain port of the 32×32 memristor array unit is connected to the third 16-to-1 switch unit and the fourth 16-to-1 switch unit to serve as an output of the memristor array unit.

Figure 3:
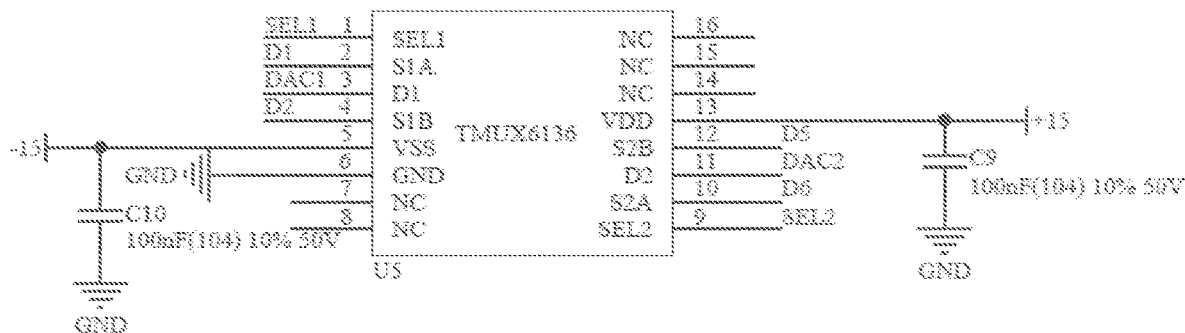
FIG. 3 is a circuit configuration diagram of a first two-way 2-to-1 switch unit according to the present invention.
Figure 4:
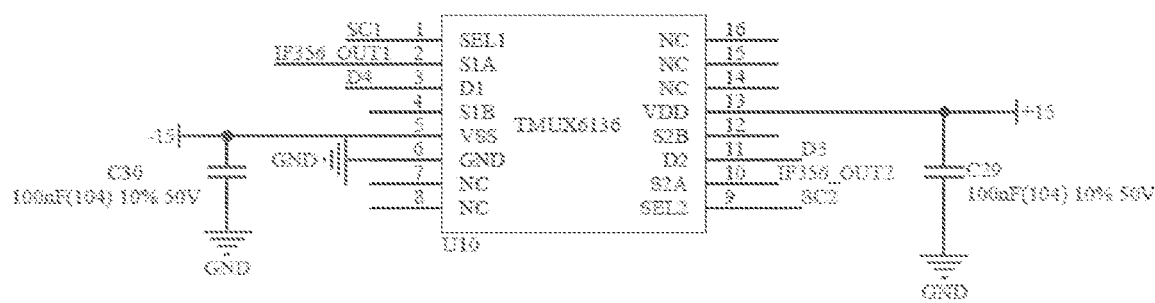
FIG. 4 is a circuit configuration diagram of a second two-way 2-to-1 switch unit according to the present invention.

Circuit diagrams of the first two-way 2-to-1 switch unit and the second two-way 2-to-1 switch unit are shown in FIG. 3 and FIG. 4 respectively.

The first two-way 2-to-1 switch unit includes a seventh chip U5. Input port D1 of the seventh chip U5 is connected to the first output terminal DAC1 of the digital-to-analog conversion unit, and input port D2 of the seventh chip U5 is connected to the second output terminal DAC2 of the digital-to-analog conversion unit. With reference to FIG. 5 to FIG. 10, port S1A of the seventh chip U5 is connected to port D1 of a first chip U6 of the first 16-to-1 switch unit, and port S1B of the seventh chip U5 is connected to port D2 of a second chip U7 of the second 16-to-1 switch unit. Port S2A of the seventh chip U5 is connected to port D6 of a sixth chip U12 of the sixth 16-to-1 switch unit, and port S2B of the seventh chip U5 is connected to port D5 of a fifth chip U11 of the fifth 16-to-1 switch unit. Port VSS of the seventh chip U5 is connected to the −15V power supply through the filter capacitor, port VDD of the seventh chip U5 is connected to the +15V power supply through the filter capacitor, and port GND of the seventh chip U5 is grounded.

The second two-way 2-to-1 switch unit includes an eighth chip U10. Input port D1 of the eighth chip U10 is connected to port D4 of a fourth chip U9 of the fourth 16-to-1 switch unit, and input port D2 of the eighth chip U10 is connected to port D3 of a third chip U8 of the third 16-to-1 switch unit. Port S1A of the eighth chip U10 is connected to port IF356_OUT1 of a first integration circuit, and port S2A of the eighth chip U10 is connected to port IF356_OUT2 of a second integration circuit. Port VSS of the eighth chip U10 is connected to the −15V power supply through the filter capacitor, port VDD of the eighth chip U10 is connected to the +15V power supply through the filter capacitor, and port GND of the eighth chip U10 is grounded.

Figure 5:
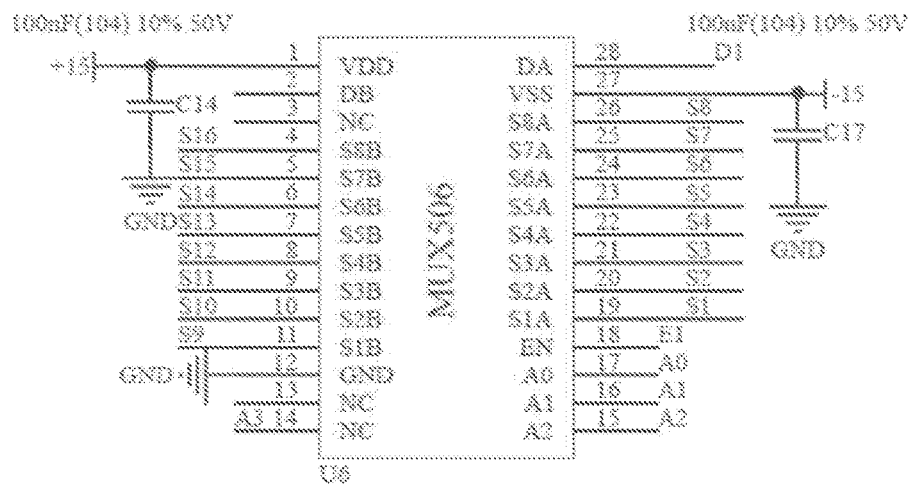
FIG. 5 is a circuit configuration diagram of a first 16-to-1 switch unit according to the present invention.

As shown in FIG. 5, the first 16-to-1 switch unit includes the first chip U6. Output ports S1A, S2A, S3A, S4A, S8A, S6A, S7A, S8A, S1B, S2B, S3B, S4B, SSB, S6B, S7B, S8B of the first chip U6 are connected to top electrodes R0_ROW1, R1_ROW2, R2_ROW3, R3_ROW4, R4_ROW5, R5_ROW6, R6_ROW7, R7_ROW8, R8_ROW9, R9_ROW10, R10_ROW11, R11_ROW 12, R12_ROW13, R13_ROW14, R14_ROW15, R15_ROW16 of the memristor array unit. Port GND of the first chip U6 is grounded, and port VDD of the first chip U6 is connected to the +15V power supplies through the filter capacitor.

Figure 6:
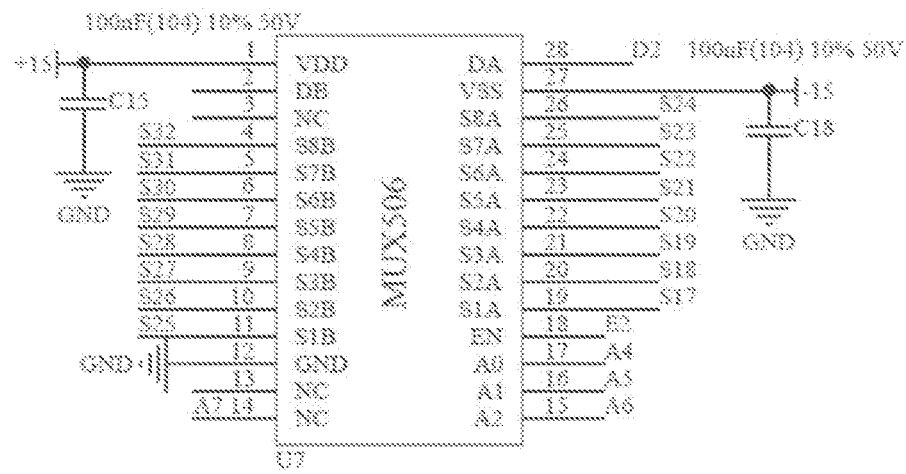
FIG. 6 is a circuit configuration diagram of a second 16-to-1 switch unit according to the present invention.

As shown in FIG. 6, the second 16-to-1 switch unit includes the second chip U7. Output ports S1A, S2A, S3A, S4A, S5A, S6A, S7A, S8A, S1B, S2B, S3B, S4B, S5B, S6B, S7B, S8B of the second chip U7 are connected to top electrodes R16_ROW17, R17_ROW18, R18_ROW19, R19_ROW20, R20_ROW21, R21_ROW22, R22_ROW23, R23_ROW24, R24_ROW25, R25_ROW26, R26_ROW27, R27_ROW28, R28_ROW29, R29_ROW30, R30_ROW31, R31_ROW32 of the memristor array unit. Port GND of the second chip U7 is grounded, and port VDD of the second chip U7 is connected to the +15V power supplies through the filter capacitor.

Figure 7:
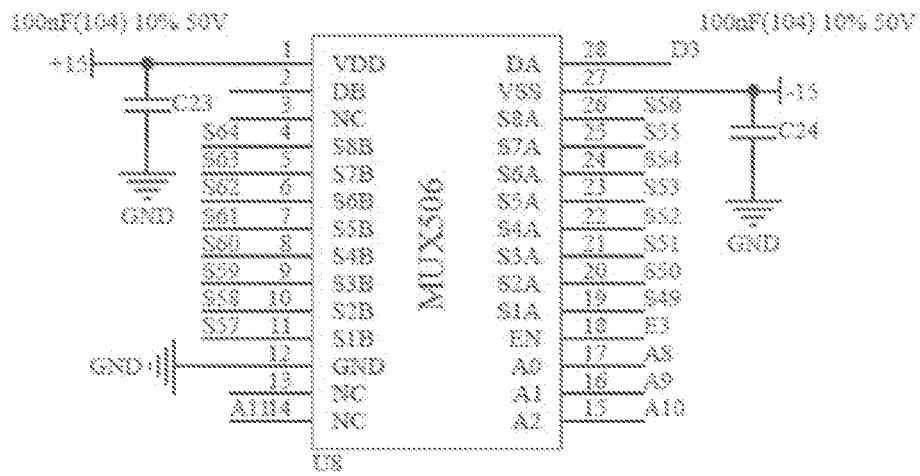
FIG. 7 is a circuit configuration diagram of a third 16-to-1 switch unit according to the present invention.

As shown in FIG. 7 the third 16-to-1 switch unit includes the third chip U8. Output ports S1A, S2A, S3A, S4A, S5A, S6A, S7A, S8A, S1B, S2B, S3B, S4B, S5B, S6B, S7B, S8B of the third chip U8 are connected to ports SL16_COL17, SL17_COL18, SL18_COL19, SL19_COL20, SL20_COL21, SL21_COL22, SL22_COL23, SL23_COL24, SL24_COL25, SL25_COL26, 26_COL27, SL27_COL28, SL28_COL29, SL29_COL30, SL30_COL31, SL31_COL32 of the memristor array unit. Port GND of the third chip U8 is grounded, and port VDD of the third chip U8 is connected to the +15V power supplies through the filter capacitor.

Figure 8:
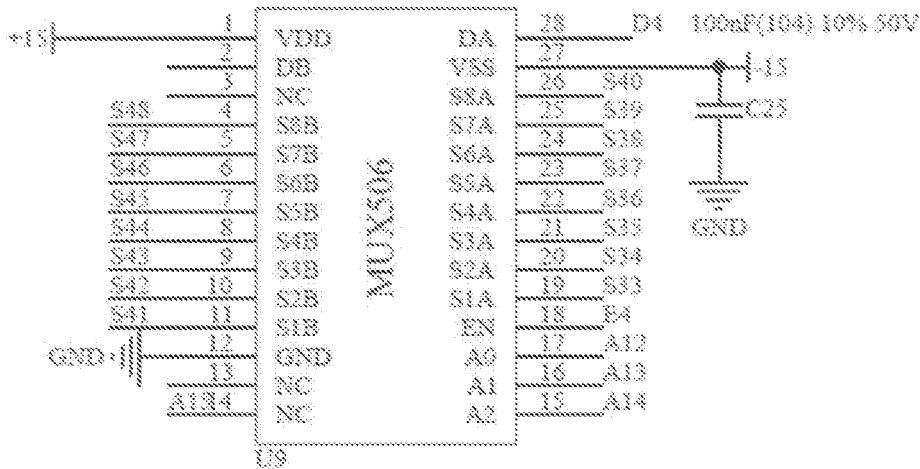
FIG. 8 is a circuit configuration diagram of a fourth 16-to-1 switch unit according to the present invention.

As shown in FIG. 8, the fourth 16-to-1 switch unit includes the fourth chip U9. Output ports S1A, S2A, S3A, S4A, S5A, S6A, S7A, S8A, S1B, S2B, S3B, S4B, S5B, S6B, S7B, S8B of the fourth chip U9 are connected to ports SL0_COL1, SL1_COL2, SL2_COL3, SL3_COL4, SL4_COL5, SL5_COL6, SL6_COL7, SL7_COL8, SL8_COL9, SL9_COL10, SL10_COL11, SL11_COL12, SL12_COL13, SL13_COL14, SL14_COL15, SL15_COL16 of the memristor array unit. Port GND of the fourth chip U9 is grounded, and port VDD of the fourth chip U9 is connected to the +15V power supplies through the filter capacitor.

Figure 9:
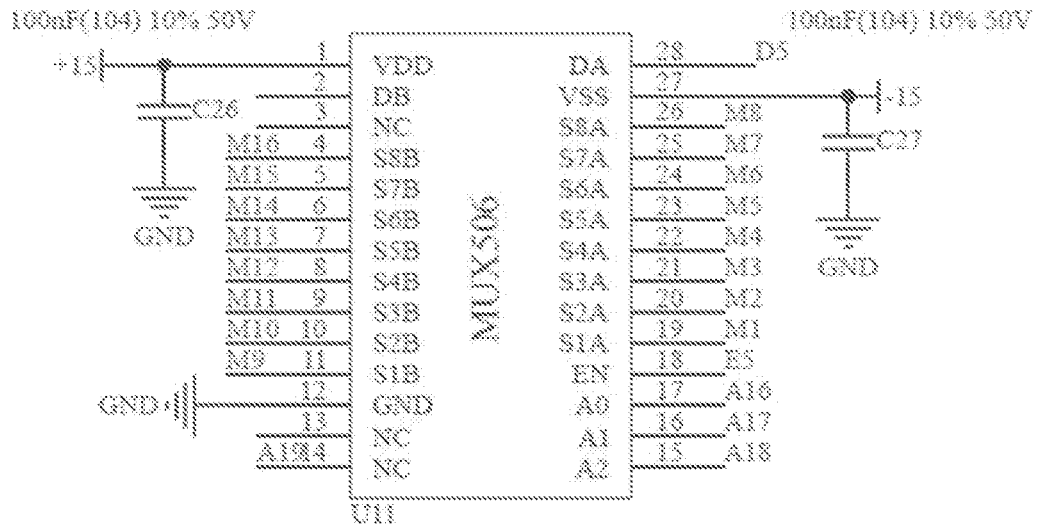
FIG. 9 is a circuit configuration diagram of a fifth 16-to-1 switch unit according to the present invention.

As shown in FIG. 9, the fifth 16-to-1 switch unit includes the fifth chip U11. Output ports S1A, S2A, S3A, S4A, S5A, S6A, S7A, S8A, S1B, S2B, S3B, S4B, S5B, S6B, S7B, S8B of the fifth chip U11 are connected to ports AD5532RWL0_T0, AD5532RWL1_T1, AD5532RWL2_T2, AD5532RWL3_T3, AD5532RWL4_T4, AD5532RWL5_T5, AD5532RWL6_T6, AD5532RWL7_T7, AD5532RWL8_T8, AD5532RWL9_T9, AD5532RWL10_0, AD5532RWL11_T11, AD5532RWL12_T12, AD5532RWL13_T13, AD5532RWL14_T14, AD5532RW_T15 of the memristor array unit. Port GND of the fifth chip U11 is grounded, and port VDD of the fifth chip U11 is connected to the +15V power supplies through the filter capacitor.

Figure 10:
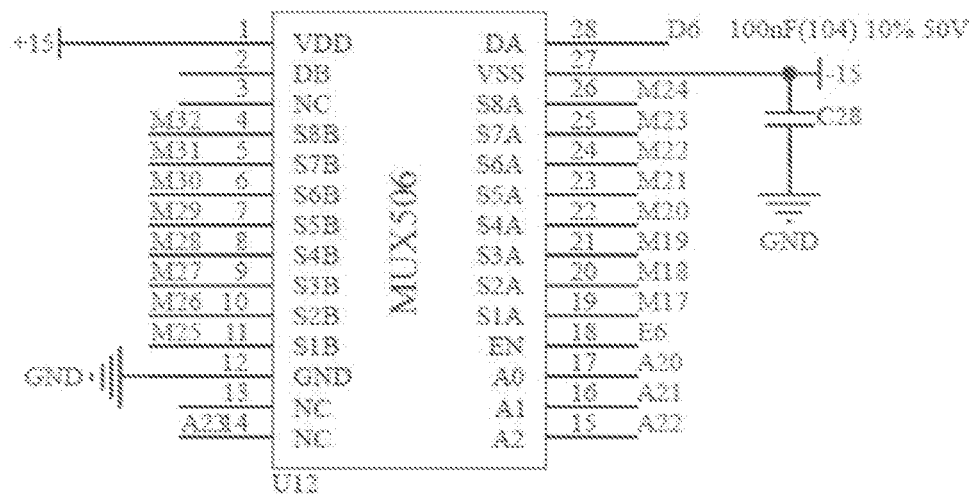
FIG. 10 is a circuit configuration diagram of a sixth 16-to-1 switch unit according to the present invention.

As shown in FIG. 10, the sixth 16-to-1 switch unit includes the sixth chip U12. Output ports S1A, S2A, S3A, S4A, S5A, S6A, S7A, S8A, S1B, S2B, S3B, S4B, S5B, S6B, S7B, S8B of the sixth chip U12 are connected to ports AD5532RWL16_T16, AD5532RWL17_T17, AD5532RWL18_T18, AD5532_RWL19_T19, AD 5532RWL20_T20, AD5532RWL21_T21, AD5532RWL23_T22, AD5532_RWL23_T23, AD5532RWL24_T24, AD5532RWL25_T25, AD5532RWL26_T26, AD5532_RWL27_T27, AD 5532RWL28_T28, AD5532RWL29_T29, AD5532RWL30_T30, AD5532_RWL31_T31 of the memristor array unit. Port GND of the sixth chip U12 is grounded, and port VDD of the sixth chip U12 is connected to the +15V power supplies through the filter capacitor.

The integration and signal amplification circuit is configured to convert the current signal output by the memristor array unit into a corresponding voltage signal, amplify the voltage signal, and output the amplified voltage signal to the analog-to-digital converter.

The integration and signal amplification circuit includes a first integration and signal amplification circuit and a second integration and signal amplification circuit.

The first integration and signal amplification circuit include the first integration circuit and a first signal amplification circuit.

Figure 11:
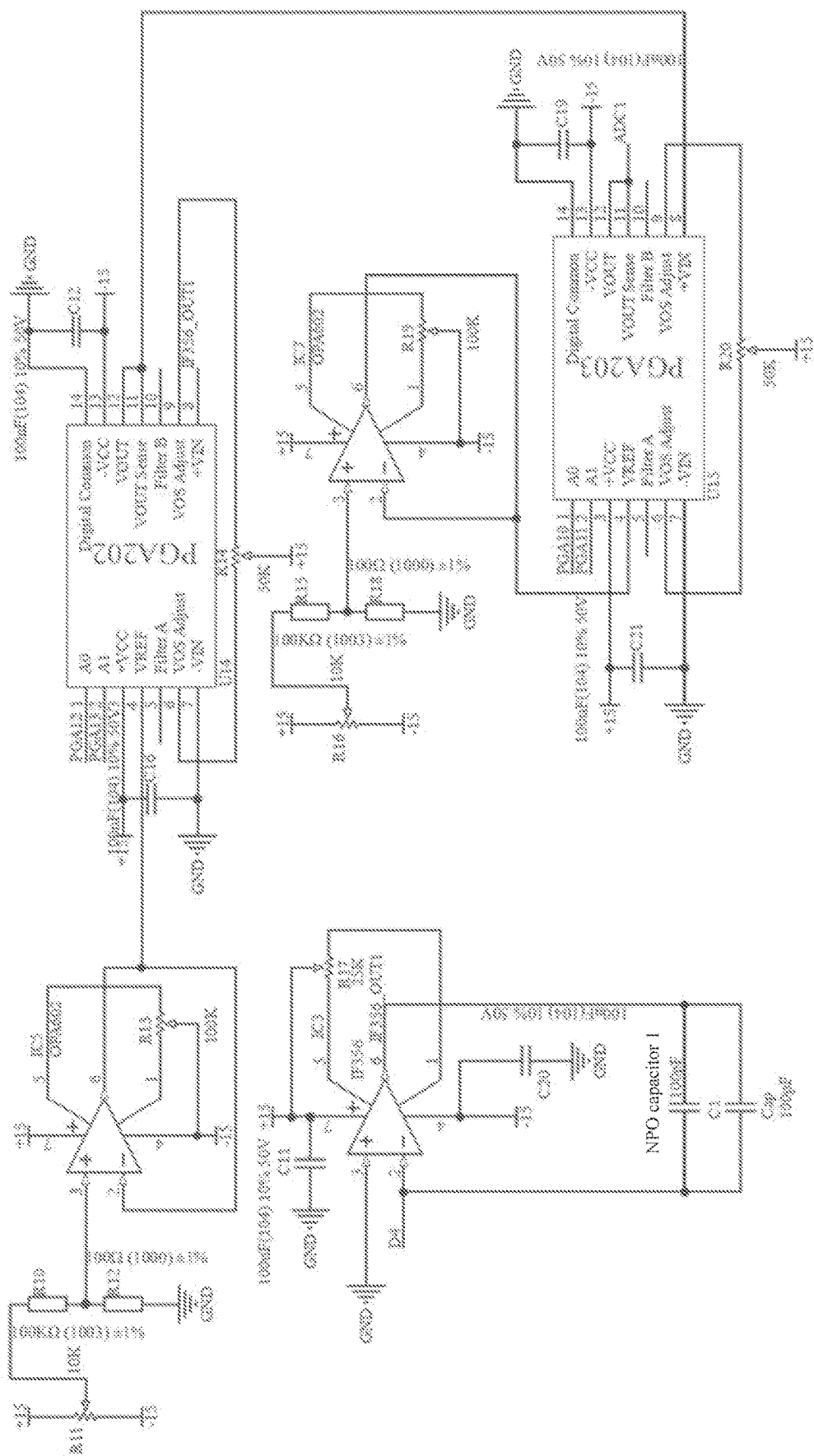
FIG. 11 is a circuit configuration diagram of a first integration and signal amplification circuit according to the present invention.

As shown in FIG. 11, the first integration circuit includes an IF356 chip. Positive input terminal 3 of the IF356 chip is grounded, reverse input terminal 2 of the IF356 chip is connected to the output port D4 of the fourth chip of the fourth 16-to-1 switch unit, and the reverse input port is connected to output port IF356_OUT1 through a capacitor C1 and an NPO capacitor 1. Port 4, namely, port V−, is connected to the −15V power supply through a coupling capacitor C20. Port 1 of the IF356 chip is connected to a first port of a first potentiometer R17, and port 5 of the IF356 chip is connected to a second port of the first potentiometer R17. A third control port of the first potentiometer R17 is connected to port 7, namely, port V+, and port V+ is connected to the +15V power supply through the coupling capacitor.

The first signal amplification circuit includes a first first-stage amplification circuit and a first second-stage amplification circuit. Output port IF356_OUT1 of the first integration circuit is connected to port +VIN of a PGA202 chip of the first first-stage amplification circuit. Port VOS Adjust 9 of the PGA202 chip is connected to a first port of a second potentiometer R14, port VOS Adjust 6 of the PGA202 chip is connected to a second port of the second potentiometer R14, and a third control port of the second potentiometer R14 is connected to +15V power supply. Port VREF of the PGA202 chip of the first first-stage amplification circuit is connected to output port 6 of a first zeroing circuit IC5 (OPA602), and reverse input port 2, namely, port −In, of the first zeroing circuit IC5 (OPA602) is connected to output port 6. A first port of a first zeroing resistor R12 is connected to port GND, a second port of the first zeroing resistor R12 is connected to a first port of a second zeroing resistor R10, and a second port of the second zeroing resistor R10 is connected to a third control port of a third potentiometer R11. A first port of the third potentiometer R11 is connected to the +15V power supply, and a second port of the third potentiometer R11 is connected to −15V power supply. Positive input port 3, namely, port +In, of the first zeroing circuit IC5 (OPA602) is connected to the second port of the first zeroing resistor R12. Port 1 of the first zeroing circuit IC5 (OPA602) is connected to a first port of a fourth potentiometer R13, port 5 of the first zeroing circuit IC5 (OPA602) is connected to a second port of the fourth potentiometer R13, and a third control port of the fourth potentiometer R13 is connected to the −15V power supply. Ports −VIN and Digital Common of the first first-stage amplification circuit are grounded. Port +VCC is connected to the +15V power supply through the filter capacitor, and port −VCC is connected to the −15V power supply through the filter capacitor. Ports A0 and A1 are connected to ports PGA12 and PGA13 of a 10-pin pin header. Ports VOUT and VOUT Sense are connected to each other to serve as an output terminal, and connected to port +VIN of the first second-stage amplification circuit to input a signal into the first second-stage amplification circuit.

Port VOS Adjust 9 of a PGA203 chip of the first second-stage amplification circuit is connected to a first port of a fifth potentiometer R20, port VOS Adjust 6 of the PGA203 chip is connected to a second port of the fifth potentiometer R20, and a third control port of the fifth potentiometer R20 is connected to the +15V power supply. Port VREF of the first second-stage amplification circuit is connected to port output 6 of a second zeroing circuit IC7 (OPA602), and reverse input port 2, namely, port −In, of the second zeroing circuit IC7 (OPA602) is connected to output port 6. A first port of a third zeroing resistor R18 is connected to port GND, a second port of the third zeroing resistor R18 is connected to a first port of a fourth zeroing resistor R15, and a second port of the fourth zeroing resistor R15 is connected to a third control port of a sixth potentiometer R16. A first port of the sixth potentiometer R16 is connected to the +15V power supply, and a second port of the sixth potentiometer R16 is connected to a −15V power supply. Positive input port 3, namely, port +In, of the second zeroing circuit IC7 (OPA602) is connected to the second port of the third zeroing resistor R18. Port 1 of the second zeroing circuit IC7 (OPA602) is connected to a first port of a seventh potentiometer R19, port 5 of the second zeroing circuit IC7 (OPA602) is connected to a second port, of the seventh potentiometer R19, and a third control port of the seventh potentiometer R19 is connected to the −15V power supply. Ports and Digital Common of the PGA203 chip of the first second-stage amplification circuit are grounded. Port +VCC is connected to the +1.5V power supply through the filter capacitor. Port −VCC is connected to the −15V power supply through the filter capacitor. Ports A0 and A1 are connected to ports PGA10 and PGA11 of the 10-pin pin header. Ports VOUT and TOUT Sense are connected to each other to serve as an output terminal, and connected to the analog-to-digital converter.

The second integration and signal amplifier circuit include a second integration circuit and a second signal amplification circuit.

Figure 12:
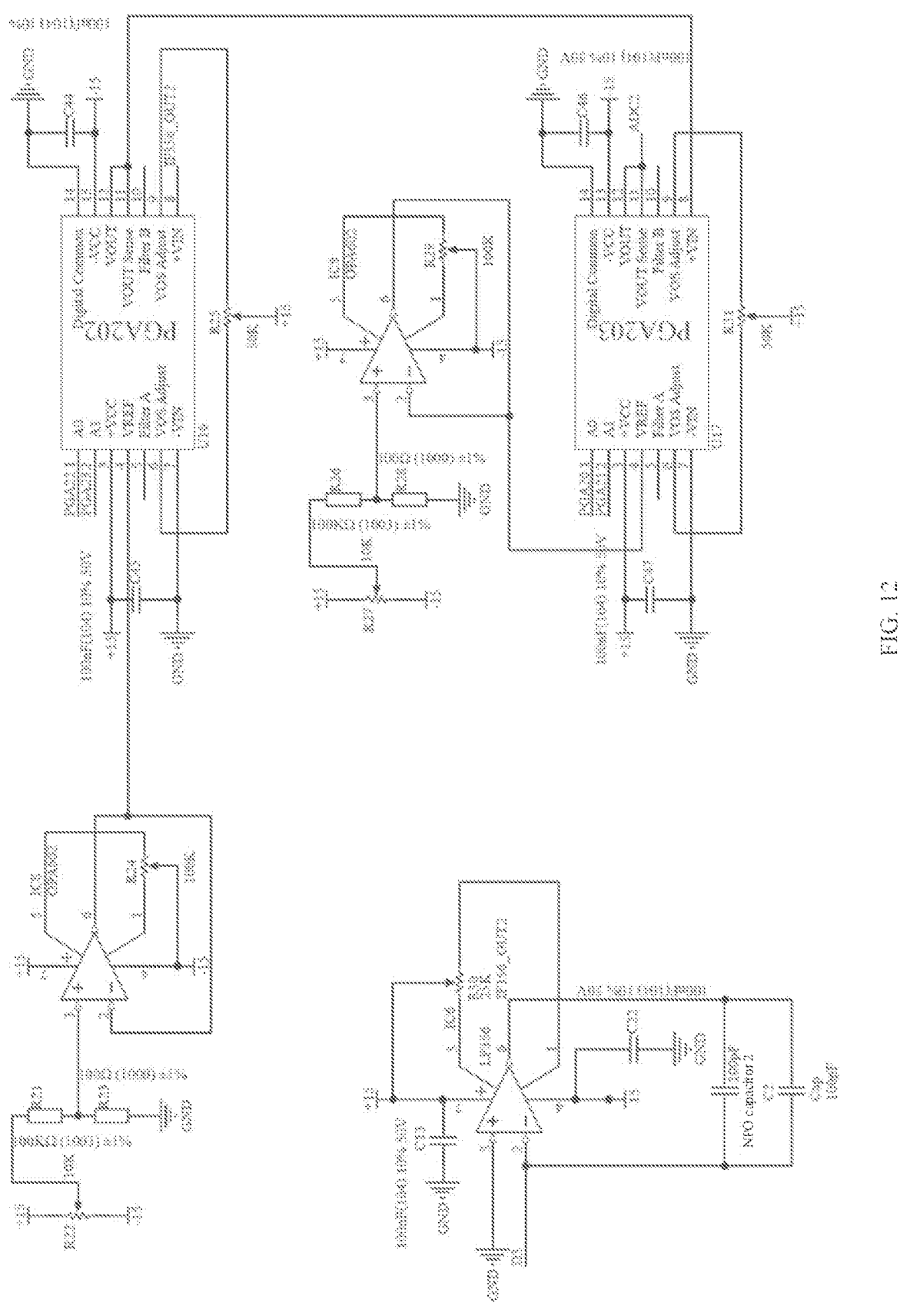

As shown in FIG. 12, the second integration circuit includes an IF356 chip. Positive input port 3 of the IF356 chip is grounded, reverse input port 2 of the IF356 chip is connected to output port D3 of the third chip of the third 16-to-1 switch unit, and reverse input port 2 is connected to output port 6, namely, IF356_OUT2, through a capacitor C2 and an NPO capacitor 2. Port 4, namely, port V−, of the IF356 chip is connected to the −15V power supply through a coupling capacitor C22. Port 1 of the IF356 chip is connected to a first port of an eighth potentiometer R30, and port 5 of the IF356 chip is connected to a second port of the eighth potentiometer R30. A third control port of the eighth potentiometer R30 is connected to port V+, and port V+ is connected to the +15V power supply through the coupling capacitor.

The second signal amplification circuit includes a second first-stage amplification circuit PGA202 and a second second-stage amplification circuit PGA203. Port IF356_OUT2 is connected to port 8, namely, port +VIN, of the second first-stage amplification circuit PGA202, port VOS Adjust 9 is connected to a first port of a ninth potentiometer R25, port VOS Adjust 6 is connected to a second port of the ninth potentiometer R25, and a third control port of the ninth potentiometer R25 is connected to the +15V power supply. Port VREF of the second first-stage amplification circuit PGA202 is connected to output port 6 of a third zeroing circuit IC8 (OPA602), and reserve input port 2, namely, port −In, of the third zeroing circuit IC8 (OPA602) is connected to port 6. A first port of a fifth zeroing resistor R23 is connected to port GND, a second port of the fifth zeroing resistor R23 is connected to a first port of a sixth zeroing resistor R21, and a second port of the sixth zeroing resistor R21 is connected to a third control port of a tenth potentiometer R22. A first port of the tenth potentiometer R22 is connected to the +15V power supply, and a second port of the tenth potentiometer R22 is connected to the −15V power supply. Positive input port 3, namely, port +In, of the third zeroing circuit IC8 (OPA602) is connected to the second port of the fifth zeroing resistor R23. Port 1 of the third zeroing circuit IC8 (OPA602) is connected to a first port of an eleventh potentiometer R24, port 5 of the third zeroing circuit IC8 (OPA602) is connected to a second port of the eleventh potentiometer R24, and a third control port of the eleventh potentiometer R24 is connected to the −15V power supply. Ports −VIN and Digital Common of the second first-stage amplification circuit PGA202 are grounded. Port +VCC is connected to the +15V power supply through the filter capacitor, and port −VCC is connected to the −15V power supply through the filter capacitor. Ports A0 and A1 ports are connected to ports PGA22 and PGA23 of the 10-pin pin header. Ports VOUT and VOUT Sense are connected to each to serve as an output terminal, and connected to port +VIN of the second second-stage amplification circuit PGA203 to input a signal into the second second-stage amplification circuit.

Port VOS Adjust 9 of the second second-stage amplification circuit PGA203 is connected to a first port of a twelfth potentiometer R13, port VOS Adjust 6 of the second second-stage amplification circuit PGA203 is connected to a second port of the twelfth potentiometer R31, and a third control port of the twelfth potentiometer R31 is connected to the +15V power supply. Port VREF of the second second-stage amplification circuit PGA203 is connected to output port 6 of a fourth zeroing circuit IC9 (OPA602), and reverse input port 2, namely, port −In, of the fourth zeroing circuit IC9 (OPA602) is connected to port 6. A first port of a seventh zeroing resistor R28 is connected to port GND, a second port of the seventh zeroing resistor R28 is connected to a first port of an eighth zeroing resistor R26, and a second port of the eighth zeroing resistor R26 is connected to a third control port of a thirteenth potentiometer R27. A first port of the thirteenth potentiometer R27 is connected to the +15V power supply, and a second port of the thirteenth potentiometer R27 is connected to the −15V port. Positive input port 3, namely, port +In, of the fourth zeroing circuit IC9 (OPA602) is connected to the second port of the seventh zeroing resistor R28. Port 1 of the fourth zeroing circuit IC9 (OPA602) is connected to a first port of a fourteenth potentiometer R29, and port 5 of the fourth zeroing circuit IC9 (OPA602) is connected to a second port of the fourteenth potentiometer R29, and a third control port of the fourteenth potentiometer R29 is connected to the −15V power supply. Ports −VIN and Digital Common of the second second-stage amplification circuit PGA203 are grounded. Port +VCC is connected to the +15V power supply through the filter capacitor. Port −VCC is connected to the −15V power supply through the filter capacitor. Ports A0 and A1 are connected to ports PGA20 and PGA 11 of the 10-pin pin header. Ports VOUT and VOUT Sense are connected to each to serve as an output terminal, and connected to the analog-to-digital converter.

The analog-to-digital converter is configured to convert an analog signal output by the integration and signal amplification circuit into a corresponding digital signal, and send the digital signal to the FPGA chip. The FPGA chip adopts an FPGA core board.

Figure 13:
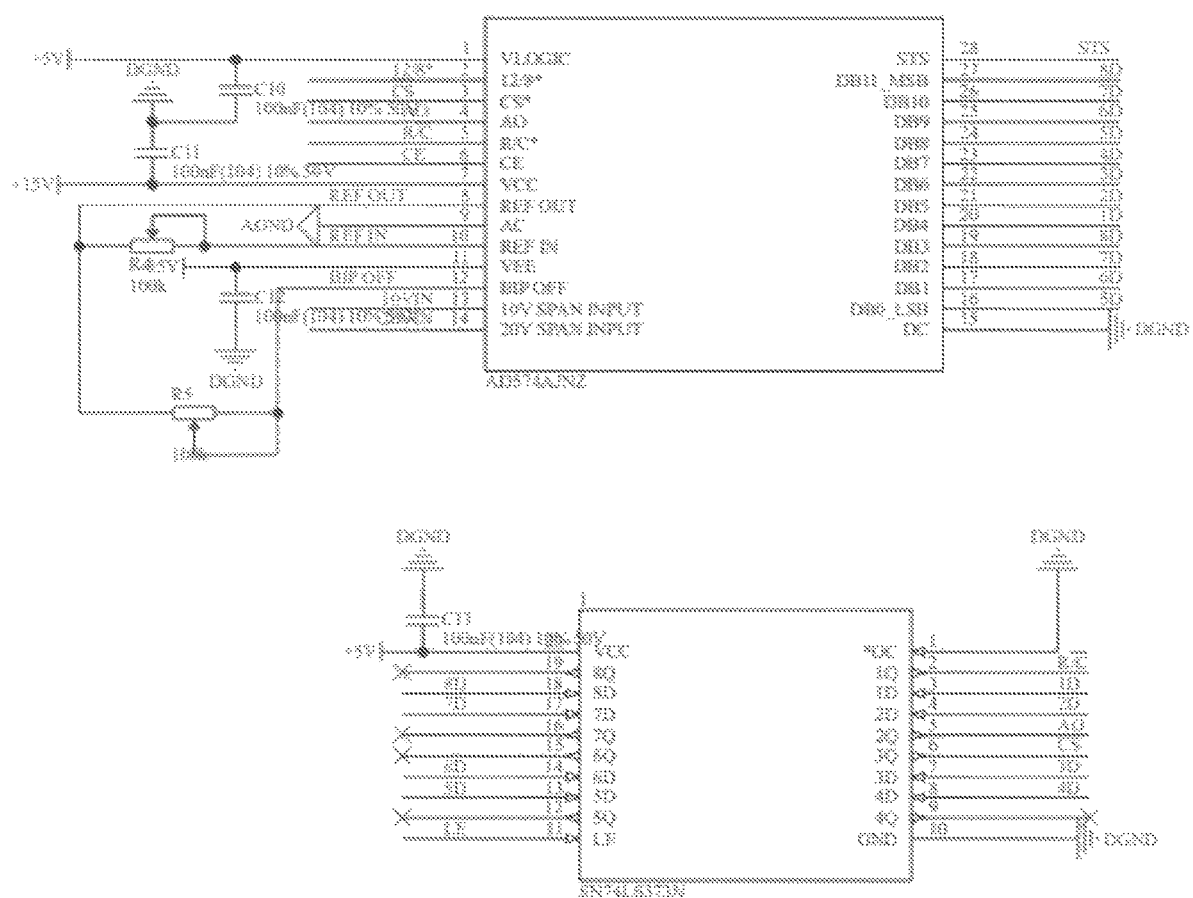
FIG. 13 is a circuit configuration diagram of an analog-to-digital converter according to the present invention.

As shown in FIG. 13, the analog-to-digital converter includes an analog-to-digital conversion chip and a latch. Port VLOGIC of the analog-to-digital conversion chip (AD574) is connected to the +5V power supply, port VCC of the analog-to-digital conversion chip is connected to the +15V power supply, both port VLOGIC and port VCC are connected to the ground through the filter capacitor, and port VEE of the analog-to-digital conversion chip is connected to the −15V power supply and the filter capacitor. Port AC is connected to port AGND, port REF OUT is connected to a first port of a fifteenth potentiometer R4, port REF IN is connected to a second port of the fifteenth potentiometer R4, a third control port of the fifteenth potentiometer R4 is connected to the second port of the fifteenth potentiometer R4, the first port of the fifteenth potentiometer R4 is also connected to a first port of a sixteenth potentiometer R5, a second port of the sixteenth potentiometer R5 is connected to the third control port and port BIP OFF of the AD574. Ports DB11 to DB4 of the analog-to-digital conversion chip are respectively connected to ports 8D to 1D of the latch (74LS373), and ports DB3 to DB0 of the analog-to-digital conversion chip are respectively connected to ports DB11 to DB8. Ports D1 to D8 of the 74LS373 chip are connected to a general input/output interface of the FPGA core board.

The circuit system in the present invention can realize reading and writing, weight modulation, and image recognition of the memristor array, which are described below separately.

1. The reading and writing function includes reading and writing of a single device in the array, reading and writing of the array, and user-defined reading and writing.

A. A reading operation includes functions of reading a single device, reading the array, performing reading setting, and saving the array. Parameters to be set herein are a quantity of array rows, a quantity of array columns, a pulse width, and a gate voltage.

1) Device Selection a) Selecting a Single Device in the Array

A single device needs to be selected before it is read and written. Quantities of rows and columns (not greater than 32×32) are set. After a loading machine sends a signal, the FPGA chip receives the signal and controls the digital-to-analog conversion unit. The digital-to-analog conversion unit converts a digital signal sent by the FPGA chip into a corresponding pulse signal, and outputs the pulse signal to the switch unit.

The FPGA chip controls the switch unit (including two source MUX switches U6 and U7, two drain MUX switches U8 and U9, and two gate MUX switches U11 and U12) of the array to select a row and a column of the array. The FPGA chip outputs signals to control the switches U6 and U7 to output control signals S1 to S32. The FPGA chip outputs signals to control the switches U8 and U9 to output 32 control signals S33 to S64. The switches U6 and U7 control the top electrode of the memristor array, and the switches U8 and U9 control the drain of the memristor array. The FPGA chip outputs signals to control output ports M1 to M16 of the switch U11 and ports M17 to M32 of the switch U12. The switches U11 and U12 control the gate of the CMOS transistor of the memristor array.

b) Selecting the Whole Array

When the whole array needs to be read or written, the whole memristor array needs to be selected. The whole memristor array may be selected in two manners. In a first manner, signals are input and output concurrently. 32 signal sources are connected to the source of the array, and 32 signal sources are connected to the gate of the memristor array. When the whole array needs to be read and written, 64 signal sources work concurrently to transmit signals to the source and the gate of the array at the same time. In this manner, the signals can be input concurrently, achieving high efficiency. However, in this manner, a cost of the 64 signal sources is large. In a second manner, signals are input and output serially. There are two signal sources. One signal source is connected to the source of the array, and the other signal source is connected to the gate of the memristor array. When the array needs to be operated, a single device in the array is selected in turn in a very short time and operated. This may be approximately regarded that the signals are input and output concurrently. Based on a cost and an actual demand, the second manner is selected in the present invention. When the array is read and written, a reading and writing task is performed on a single device in sequence.

c) User-Defined Selection

When the array is operated, several devices in the array sometimes need to be read and written. When several devices in the array need to be operated, quantities of rows and columns of these devices need to be selected, and these several devices can be operated after signal setting.

2) Reading Operation

After a to-be-operated device (which may be a single device, the whole array, or several devices defined by a user) is selected in the array, the pulse width is set to 2000 us and the gate voltage is set to 0.4 V herein based on a characteristic of a material in the array. It should be noted that although the signal is a pulse when the device is read, a micro signal also has certain impact on the device, affecting reading and writing accuracy of the whole system. In order to reduce an error, positive and negative pulse signals with a same pulse width and opposite gate voltage polarities are used. Data is automatically saved after the reading operation is completed.

B. A writing operation includes pulse writing, scanning writing, and user-defined writing.

1) Pulse writing. Pulse writing can be divided into a single-pulse writing mode and a multi-pulse writing mode. Parameters to be set herein include: the quantity of rows, the quantity of columns, a high-effectiveness pulse width (≤2 S), a low-effectiveness pulse, a pulse amplitude (±5V), the gate voltage, a quantity of pulses, and a quantity of sampling points.

a) Pulse writing is selected. In this case, the pulse writing mode is valid.

b) Quantities of rows and columns of a to-be-operated device in the array, a quantity of required pulses are selected, and a corresponding gate voltage is set.

c) Pulse compilation is performed. The pulse width, a pulse cycle, and the pulse amplitude are input.

d) Array writing is selected to perform an operation.

e) Data is saved.

2) Scanning writing. Parameters to be set for scanning writing include: the quantity of rows, the quantity of columns, an effective pulse width (≤2 S), the pulse width (±5V), the gate voltage, a quantity of pulse orders, and the quantity of sampling points.

3) User-defined writing. in user-defined writing, the user operates a specific device in the array based on a demand of the user. For the user-defined writing operation, a user-defined netlist needs to be downloaded first, the user-defined writing operation is preformed, and then a result of the user-defined writing operation is read. The quantity of rows, the quantity of columns, a user-defined writing direction, the quantity of pulses, and the gate voltage need to be set for the user-defined netlist.

2. Weight modulation. Weight modulation is a process in which the system automatically adjusts a weight of the array based on a target weight of the user. Weight modulation includes one-time modulation, gate voltage modulation, array modulation, pulse modulation, and pulse width modulation.

1) One-time modulation. One-time modulation is fixed gate voltage modulation. For the gate voltage, only a SET voltage and a RESET voltage need to be provided, and other parameters are modulated based on device performance. Based on the device performance, an adjustment value is within ±3V.

2) Gate voltage modulation. Gate voltage modulation needs to be combined with pulse modulation. For gate voltage modulation, a maximum gate voltage, a minimum gate voltage, and a gate voltage step need to be set.

3) Array modulation. Array modulation is to modulate a weight of the whole array. Array modulation needs to be combined with gate voltage modulation. For array modulation, it is necessary to read an excel file (including target parameters), set termination of modulation (it is specified that modulation is successful when an error is within 200 Ω) and a quantity of cycles, and read a conductance value of the array.

4 Pulse width modulation. Pulse width modulation covers the pulse width amplitude and the pulse width. For the pulse width amplitude, an initial positive amplitude and an initial negative amplitude need to be set. For the pulse width, an initial pulse width, a maximum pulse width, and a pulse width step need to be set.

3. Image recognition. Image recognition is to modulate a target weight of the array based on weight modulation. The target weight is stored on a to-be-recognized image, and a pixel value of the image corresponds to a conductance value linearly. The conductance value is a target conductance value. The system performs weight modulation on the array based on the target value, and it is considered that modulation is completed when an error is within an error range. Different input images correspond to different input signals. Different input signals are modulated repeatedly in the array chip until a next-stage integration circuit sends a corresponding pulse signal. The signal amplification circuit amplifies the signal, the analog-to-digital converter converts the signal into a digital signal and sends the digital signal to the FPGA chip, and then the FPGA chip sends the signal to the PC to display a result.

What is claimed is:

1. A circuit system for weight modulation and image recognition of a memristor array, comprising a personal computer (PC), a field-programmable gate array (FPGA) chip, a digital-to-analog conversion unit, a switch unit, a memristor array unit, an integration and signal amplification circuit, and an analog-to-digital converter, wherein
the PC is connected to the FPGA chip, and the FPGA chip is further connected to the digital-to-analog conversion unit and the analog-to-digital converter;
the digital-to-analog conversion unit is configured to receive a digital signal sent by the FPGA chip, perform voltage reduction on the digital signal, convert the digital signal into a pulse signal corresponding to the digital signal, and output the pulse signal to the switch unit;
the switch unit comprises a first two-way 2-to-1 switch unit, a second two-way 2-to-1 switch unit, a first 16-to-1 switch unit, a second 16-to-1 switch unit, a third 16-to-1 switch unit, a fourth 16-to-1 switch unit, a fifth 16-to-1 switch unit, and a sixth 16-to-1 switch unit, wherein
an input terminal of the first two-way 2-to-1 switch unit is connected to an output terminal of the digital-to-analog conversion unit;
the first two-way 2-to-1 switch unit has a first output terminal and a second output terminal, wherein
the first output terminal is connected to a source of a complementary metal oxide semiconductor (CMOS) transistor of a device in the memristor array unit through the first 16-to-1 switch unit and the second 16-to-1 switch unit, and
the second output terminal is connected to a gate of the CMOS transistor of the device in the memristor array unit through the fifth 16-to-1 switch unit and the sixth 16-to-1 switch unit;
a drain of the CMOS transistor of the device in the memristor array unit is connected to the second two-way 2-to-1 switch unit through the third 16-to-1 switch unit and the fourth 16-to-1 switch unit, and the second two-way 2-to-1 switch unit is connected to the analog-to-digital converter through the integration and signal amplification circuit;
the switch unit is configured to select the source and the gate of the CMOS transistor of the device in the memristor array unit, input the pulse signal output by the digital-to-analog conversion unit into the source and the gate of the corresponding device, and perform selective output on an output terminal of the drain;
the memristor array unit is configured to convert the pulse signal into a current signal corresponding to the pulse signal, and output the current signal to the switch unit for selective output;
the integration and signal amplification circuit is configured to convert the current signal output by the memristor array unit into a voltage signal corresponding to the current signal, amplify the voltage signal to obtain an amplified voltage signal, and output the amplified voltage signal to the analog-to-digital converter; and
the analog-to-digital converter is configured to convert an analog signal output by the integration and signal amplification circuit into a digital signal corresponding to the analog signal, and send the digital signal to the FPGA chip.

2. The circuit system according to claim 1, wherein the memristor array unit is a 32×32 memristor array unit.

3. The circuit system according to claim 1, wherein each of the first two-way 2-to-1 switch unit and the second two-way 2-to-1 switch unit comprises a TMUX6136 chip.

4. The circuit system according to claim 1, wherein each of the first 16-to-1 switch unit, the second 16-to-1 switch unit, the third 16-to-1 switch unit, the fourth 16-to-1 switch unit, the fifth 16-to-1 switch unit and the sixth 16-to-1 switch unit comprises a MUX506 chip.

5. The circuit system according to claim 1, wherein the digital-to-analog conversion unit comprises an AD7847 digital-to-analog conversion chip and two AD711 operational amplifiers.

6. The circuit system according to claim 1, wherein the integration and signal amplification circuit comprises an integration circuit and a signal amplification circuit; wherein
the integration circuit comprises an IF356 chip; and
the signal amplification circuit comprises a first-stage amplification circuit and a second-stage amplification circuit, wherein the first-stage amplifier circuit comprises a PGA202 chip, and the second-stage amplifier circuit comprises a PGA203 chip.

7. The circuit system according to claim 6, wherein the first-stage amplification circuit and the second-stage amplification circuit are respectively connected to a zeroing circuit, and the zeroing circuit comprises an OPA602 chip.

8. The circuit system according to claim 1, wherein the analog-to-digital converter comprises an AD574 analog-to-digital conversion chip and a 74LS373 latch.

* * * * *